United States Patent
Yang et al.

(10) Patent No.: US 7,332,743 B2
(45) Date of Patent: Feb. 19, 2008

(54) THIN FILM TRANSISTOR ARRAY PANEL AND LIQUID CRYSTAL DISPLAY

(75) Inventors: Young-Chol Yang, Seongnam-si (KR); Keun-Kyu Song, Seongnam-si (KR); Bo-Sung Kim, Seoul (KR); Mun-Pyo Hong, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/224,103

(22) Filed: Sep. 13, 2005

(65) Prior Publication Data

US 2006/0131580 A1    Jun. 22, 2006

(30) Foreign Application Priority Data

Dec. 17, 2004  (KR) .................... 10-2004-0108172

(51) Int. Cl.
*H01L 31/00* (2006.01)

(52) U.S. Cl. ............... 257/59; 257/72; 257/E27.131

(58) Field of Classification Search .............. 349/43, 349/42, 139, 143; 257/59, 72, E27.131, 257/E27.132
See application file for complete search history.

(56) References Cited

U.S. PATENT DOCUMENTS

| 5,706,064 | A * | 1/1998 | Fukunaga et al. ............. 349/43 |
| 6,493,052 | B1 | 12/2002 | Satake et al. |
| 6,750,931 | B2 | 6/2004 | Satake et al. |
| 2004/0046908 | A1 | 3/2004 | Shih et al. |

FOREIGN PATENT DOCUMENTS

| JP | 08-015719 | 1/1996 |
| JP | 08-220518 | 8/1996 |
| JP | 10-305369 | 11/1998 |
| JP | 11-344726 | 12/1999 |
| JP | 2000-231109 | 8/2000 |
| KR | 1020010058150 | 7/2001 |
| KR | 100354630 | 9/2002 |
| KR | 1020040069014 | 8/2004 |

* cited by examiner

*Primary Examiner*—Minhloan Tran
*Assistant Examiner*—Benjamin Tzu-Hung Liu
(74) *Attorney, Agent, or Firm*—Cantor Colburn LLP

(57) ABSTRACT

A thin film transistor array panel is provided, which includes an insulating substrate, a gate line formed on the insulating substrate, a gate insulating layer covering the gate line, a data line formed on the gate insulating layer, a lower passivation layer covering the data line, an upper passivation layer formed on the lower passivation layer and made of organic insulating material, and a pixel electrode formed on the upper passivation layer. The thicknesses of the gate insulating layer, the lower passivation layer, and the pixel electrode are respectively represented as $d_G$, $d_P$, and $d_I$, the refraction indexes of the gate insulating layer, the passivation layer, and the pixel electrode are respectively represented as $n_G$, $n_P$, and $n_I$, and condition equations are satisfied according to: $4(d_G n_G + d_P n_P) =$, which is an even multiple of the wavelength; and $4 d_I n_I =$, which is an even multiple of the wavelength.

6 Claims, 7 Drawing Sheets

THIN FILM TRANSISTOR ARRAY PANEL AND LIQUID CRYSTAL DISPLAY

CROSS REFERENCE TO RELATED APPLICATION

This application claims priority to and the benefit of Korean Patent Application No. 10-2004-0108172 filed on Dec. 17, 2004, which is hereby incorporated by reference for all purposes as if fully set forth herein.

BACKGROUND OF THE INVENTION

1. Field of the Invention

The present invention relates to a thin film transistor array panel and a liquid crystal display.

2. Description of the Related Art

A flat panel display, such as a liquid crystal display (LCD) and an organic light emitting display (OLED), includes a thin film transistor (TFT) array panel to individually control a plurality of pixels.

The thin film transistor array panel includes a plurality of pixels arranged in a matrix, and a plurality of signal lines to drive the pixels, such as gate lines for transmitting scanning signals and data lines for transmitting data signals. Each pixel includes a pixel electrode, and a TFT connected with the gate lines and the data lines to control the data signals. A gate insulating layer and a passivation layer are formed between the gate and data lines and the thin film transistor to insulate therebetween.

The thin film transistor includes gate electrodes connected with the gate lines, source electrode connected with the data lines, drain electrodes connected with the pixel electrodes, semiconductors in which a channel of the thin film transistor is formed, and a gate insulating layer between the gate electrode and the semiconductors.

In the liquid crystal display, an organic insulating layer having a low dielectric is used as the passivation layer to improve an aperture ratio by minimizing parasitic capacitance between the pixel electrode and the signal lines. Accordingly, the interval between the pixel electrode and the signal lines decreases to approximately 3-4 microns compared with an inorganic insulating layer, or the pixel electrode and the signal lines overlap with each other to improve the aperture ratio.

The transmittance of the LCD is decreased due to low transmittance of the organic insulating layer, or an interference phenomenon according to multi-reflection generated by the different interlayer refraction indexes.

SUMMARY OF THE INVENTION

This invention provides for a thin film transistor array panel and a liquid crystal display.

Additional features of the invention will be set forth in the description which follows, and in part will be apparent from the description, or may be learned by practice of the invention.

The present invention discloses a thin film transistor array panel, including an insulating substrate, a gate line formed on the insulating substrate, a gate insulating layer covering the gate line, a data line formed on the gate insulating layer, a lower passivation layer covering the data line, an upper passivation layer formed on the lower passivation layer and comprising an organic insulating material, and a pixel electrode formed on the upper passivation layer, wherein the gate insulating layer, the lower passivation layer, and the pixel electrode satisfies the following condition equations: $4(d_G n_G + d_P n_P) =$, which is an even multiple of the wavelength, and $4d_I n_I =$, which is an even multiple of the wavelength, and wherein the thicknesses of the gate insulating layer, the lower passivation layer, and the pixel electrode are respectively represented as $d_G$, $d_P$, and $d_I$ and the refraction index of the gate insulating layer, the passivation layer, and the pixel electrode are represented as $n_G$, $n_P$, and $n_I$, respectively.

The present invention also discloses liquid crystal display, including a first substrate, a gate insulating layer formed on the first substrate, a lower passivation layer formed on the gate insulating layer, an upper passivation layer formed on the lower passivation layer and comprising an organic insulating material, a pixel electrode formed on the upper passivation layer, a second substrate facing the first substrate, and a liquid crystal layer formed between the first substrate and the second substrate, wherein the gate insulating layer, the lower passivation layer, and the pixel electrode satisfy the following condition equations: $4(d_G n_G + d_P n_P) =$, which is an even multiple of the wavelength, and $4d_I n_I =$, which is an even multiple of the wavelength, and wherein the thicknesses of the gate insulating layer, the lower passivation layer, and the pixel electrode are respectively represented as $d_G$, $d_P$, and $d_I$, the refraction index of the gate insulating layer, the passivation layer, and the pixel electrode are represented as $n_G$, $n_P$, and $n_I$, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DESCRIPTION OF THE ILLUSTRATED EMBODIMENTS

Figure 1:
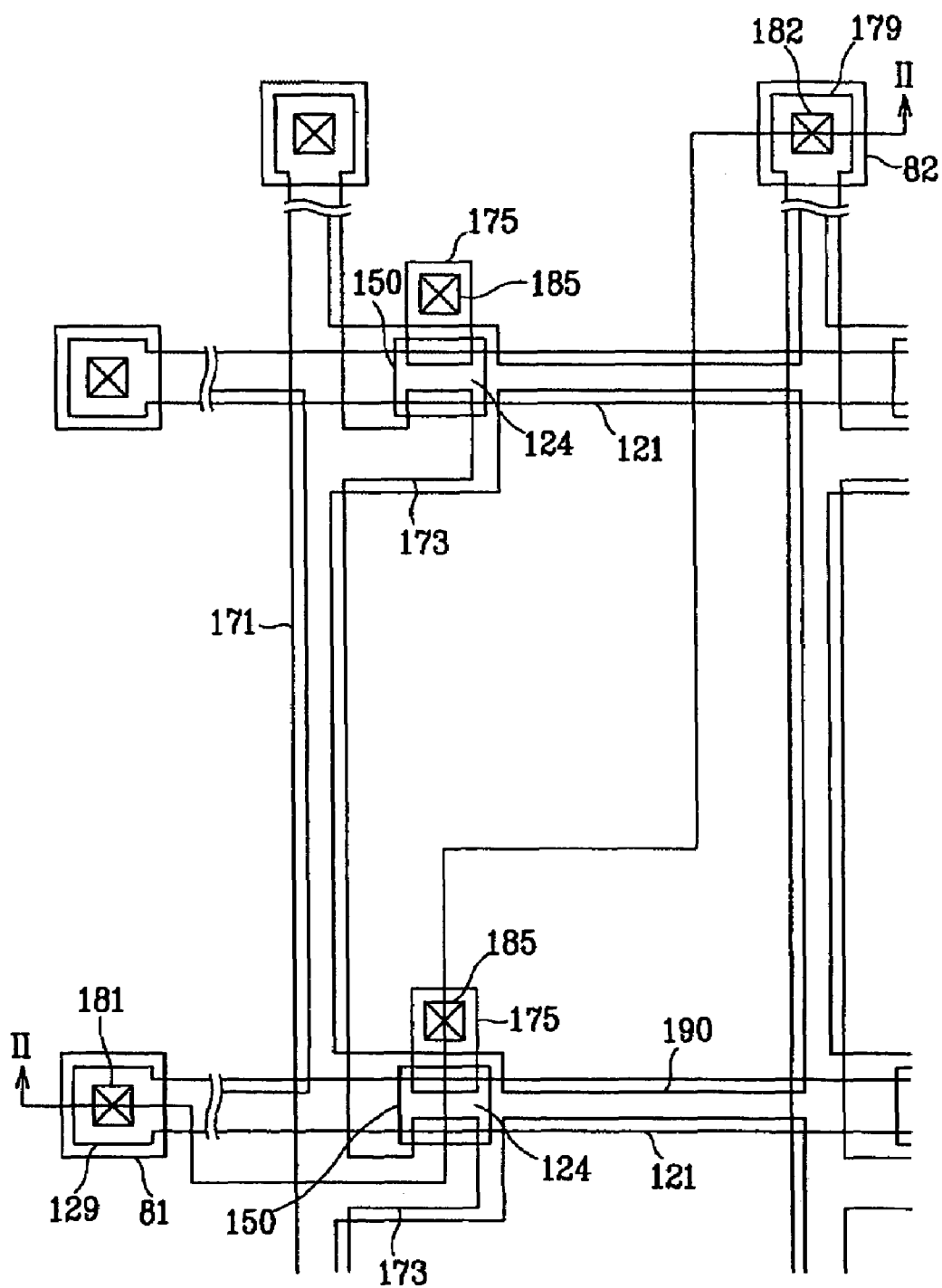
FIG. 1 is a layout view of a TFT array panel for an LCD according to an embodiment of the invention.

The present invention now will be described more fully hereinafter with reference to the accompanying drawings, in which preferred embodiments of the invention are shown. The present invention may, however, be embodied in many different forms and should not be construed as limited to the embodiments set forth herein.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A TFT array panel and an LCD including the panel according to embodiments of the invention are described below with reference to the accompanying drawings.

A TFT array panel for an LCD is described below with reference to FIG. 1 and FIG. 2.

The TFT array panel may include a display area in which a plurality of signal lines, a plurality of thin film transistors, and a plurality of pixel electrodes are disposed, and a periphery area in which a plurality of end portions of the signal lines are disposed.

Figure 2:
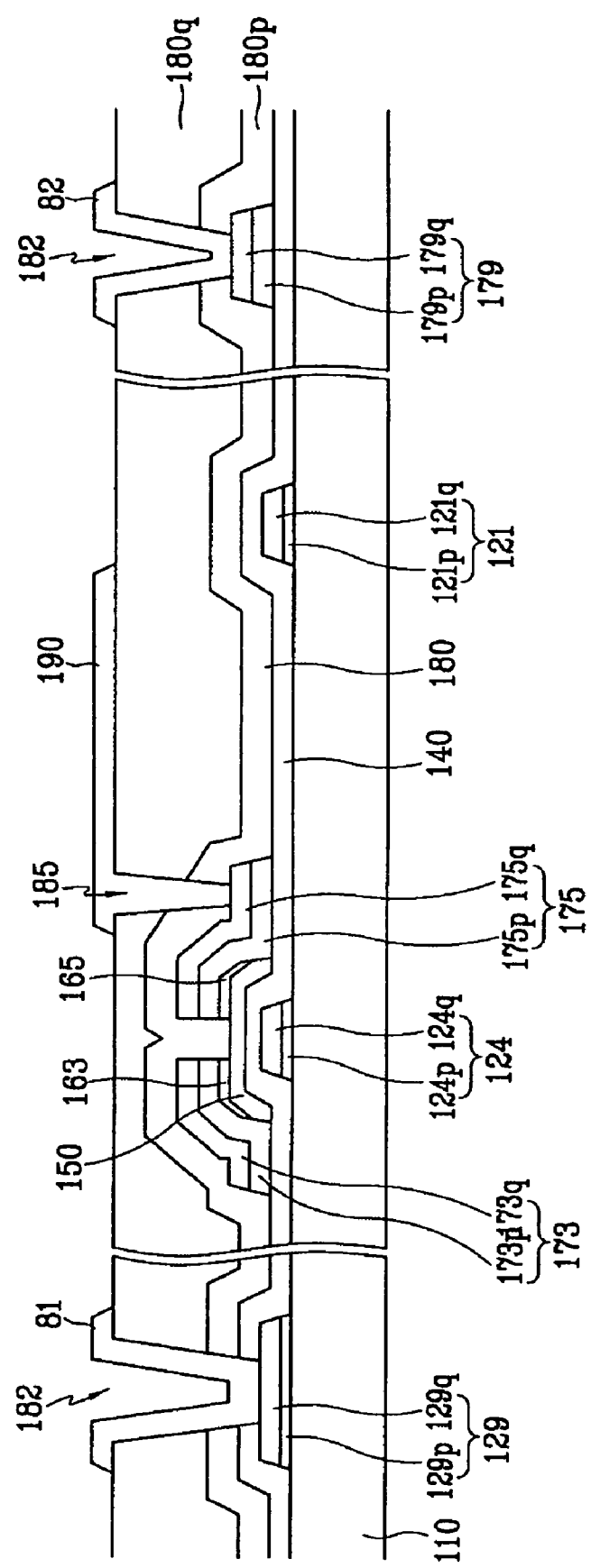
FIG. 2 is a sectional view of the TFT array panel shown in FIG. 1 taken along the lines II-II'.

FIG. 1 is a layout view of a TFT array panel for an LCD and FIG. 2 is a sectional view of the TFT array panel shown in FIG. 1 taken along the lines II-II'.

A plurality of gate lines 121 are formed on an insulating substrate 110, such as transparent glass.

The gate lines 121 may extend substantially in a transverse direction and are separated from each other and transmit gate signals. Each gate line 121 includes a plurality of portions forming a plurality of gate electrodes 124, and an end portion 129 having an area sufficient for contact with another layer or an external driving circuit. The gate lines 121 may connect with a driving circuit that may be integrated or formed on the insulating substrate 110. Most of the gate lines 121 are disposed in the display area and the end portions 129 are disposed in the periphery area.

As shown in FIG. 2, the gate lines 121 may include two films having different physical characteristics, a lower film 121p and an upper film 121q. The upper film 121q may be made of a low resistivity metal including an Al-containing metal such as Al and an Al alloy for reducing signal delay or voltage drop in the gate lines 121. The lower film 121p may be made of a material such as Cr, Ti, Ta, Mo, and a Mo alloy, which have good physical, chemical, and electrical contact characteristics with other materials such as indium tin oxide (ITO) and indium zinc oxide (IZO). For example, the gate line 121 may include a lower film material of Cr and an upper film material of an Al—Nd alloy.

In FIG. 2, the lower and the upper films of the gate electrodes 124 are indicated by reference numerals 124p and 124q, respectively, and the lower film 124p and the upper film 124q of the end positions 129 are indicated by reference numerals 129p and 129q, respectively. Portions of the upper film 129q of the end portions 129 of the gate lines 121 may be removed to expose the underlying portions of the lower films 129p.

The lateral sides of the upper film 121q, 124q, and 129q, and the lower film 121p, 124p, and 129p, may be tapered, and the inclination angle of the lateral sides with respect to a surface of the substrate 110 may ranges from approximately 30 to 80 degrees.

A gate insulating layer 140, preferably made of silicon nitride (SiNx), may be formed on the gate lines 121.

A plurality of semiconductor islands 150, which may be made of hydrogenated amorphous silicon ("a-Si") are formed on the gate insulating layer 140. Each of the semiconductor islands 150 are provided on the gate electrodes 124, and each of the semiconductor islands 150 becomes wider near the gate electrodes 124 such that the semiconductor islands 150 cover large areas near the gate electrodes 124.

A plurality of ohmic contact islands 163 and 165, which may be made of silicide or n+ hydrogenated a-Si heavily doped with an n-type impurity, are formed on the semiconductor islands 150. Each of the ohmic contact islands 163 and 165 are located in pairs on the semiconductor islands 150.

The lateral sides of the semiconductor islands 150 and the ohmic contacts 163 and 165 may be tapered, and the inclination angles thereof may be between approximately 30 and 80 degrees.

A plurality of data lines 171 and a plurality of drain electrodes 175 are formed on the ohmic contacts 163 and 165 and the gate insulating layer 140.

The data lines 171 transmit data voltages and extend in a substantially longitudinal direction and intersect the gate lines 121. Each data line 171 includes an expansion 179 having an area sufficient for contact with another layer or an external device. A plurality of branches of each data line 171, which extent toward the drain electrodes 175, form a plurality of source electrodes 173.

Each pair of the source electrodes 173 and the drain electrodes 175 are separated from each other and opposite each other with respect to a gate electrode 124. The gate electrode 124, the source electrode 173, the drain electrode 175, and the semiconductor 150 form a TFT having a channel formed in the semiconductor 150 disposed between the source electrode 173 and the drain electrode 175.

The data lines 171 and the drain electrodes may include multiple films having different physical characteristics, e.g., a lower film 171p and an upper film 171q. The lower film 171p may be made of material such as Cr, Mo, and a Mo alloy, and the upper film 171q may be made of a material including an Al-containing metal, such as Al and an Al alloy, or an Ag-containing metal, such as Ag and an Ag alloy. The lower and the upper films of the drain electrodes are indicated by reference numerals 175p and 175q, respectively, and the lower and the upper films of the end positions 179 are indicated by reference numerals 179p and 179q, respectively.

The lateral sides of the upper film 171q, 175q, and 179q, and the lower film 171p, 175p, and 179p may tapered. The inclination angle of the lateral sides with respect to a surface of the substrate 110 may range from approximately 30 to 80 degrees.

The ohmic contacts 163 and 165 may only be interposed between the underlying semiconductor 150 and the overlying data lines 171 and the overlying drain electrodes 175 thereon to reduce the contact resistance therebetween. The semiconductor 150 includes a plurality of exposed portions, which are not covered with the data lines 171 and the drain electrodes 175, such as portions located between the source electrodes 173 and the drain electrodes 175.

A lower passivation layer 180p, which may be made of an inorganic material such as silicon nitride or silicon oxide, may be formed on the data lines 171, the drain electrodes 175, and the exposed portions of the semiconductor 150.

An upper passivation layer 180q, which may be made of a photosensitive organic material that is sufficiently level or flat, may be formed on the lower passivation layer 140p.

The upper and lower passivation layers 180q and 180p have a plurality of contact holes 182 and 185 exposing the end portions 179 of the data lines 171 and the drain electrodes 175, respectively. The upper passivation layer 180q, the lower passivation layer 180p, and the gate insulating layer 140 have a plurality of contact holes 181 exposing end portions 129 of the gate lines 121.

It is understood that the lower passivation layer 180p may be omitted if necessary.

A plurality of pixel electrodes 190 and a plurality of contact assistants 81 and 82, which may be made of IZO or ITO, are formed on the upper passivation layer 180q.

The pixel electrodes 190 are physically connected to and coupled with the drain electrodes 175 through the contact holes 185 such that the pixel electrodes 190 receive the data voltages from the drain electrodes 175.

The pixel electrodes 190 supplied with the data voltages generate electric fields in cooperation with a common electrode (not shown) on another panel (not shown)to reorient liquid crystal molecules in a liquid crystal layer (not shown) disposed therebetween.

A pixel electrode 190 and a common electrode form a liquid crystal capacitor, which stores applied voltages after the TFT is turned-off. An additional capacitor called a "storage capacitor," connected in parallel to the liquid crystal capacitor, may be provided for enhancing the voltage storing capacity.

The pixel electrodes 190 may be overlapped with the gate lines 121 and the data lines 171 to increase the aperture ratio.

The contact assistants 81 and 82 may be connected with the exposed end portions 129 of the gate lines 121 and the exposed end portions 179 of the data lines 171 through the contact holes 181 and 182, respectively. The contact assistants 81 and 82 protect the exposed portions 129 and 179 of the data lines and complement the adhesiveness of the exposed portion 129 and 179 and external devices.

The contact assistant 81 assists in connecting the end portions 129 of the gate lines 121 and a gate driving circuit when the gate driving circuit is integrated or formed on the insulating substrate 110.

As shown in FIG. 1 and FIG. 2, the gate lines 121 and the data lines 171 have a double layered structure, however, it is understood that they may be a single layered structure, or have a multi-layered structure.

Next, the layered structure of the display area of FIG. 2 is described with the reference to a drawing.

Figure 3:
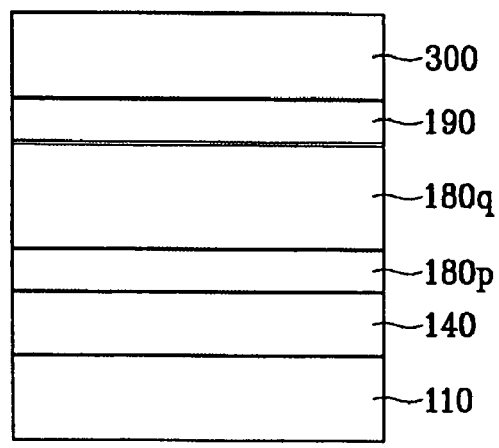
FIG. 3 is a sectional view of the deposition structure of a display area in the TFT array panel.

FIG. 3 is a sectional view of the structure of a display area of the TFT array panel.

Referring to FIG. 3, a gate insulating layer 140 made of silicon nitride is formed on an insulating substrate 110. A lower passivation layer 180p made of silicon nitride is formed on the gate insulting layer 140. An upper passivation layer 180q is formed on the lower passivation layer 180p. A pixel electrode 190 is formed on the upper passivation layer 180q. A liquid crystal 300 is formed on the pixel electrode 190. Accordingly, the light from backlight sequentially passes through multiple layers of the structure, for example, layer 110, 140, 180p, 180q, and 190, and travels through the liquid crystal layer 300 such that the transmittance changes to display images in the LCD.

Therefore, the transmittances for each layer under the liquid crystal layer 300 should be optimized to enhance the luminance of the LCD, and an equation to obtain the optimized transmittances for the each layer is provided below.

The refraction indexes of the gate insulating layer 140 and the lower passivation layer 180p are typically approximately 1.8-1.9, and the refraction index of the pixel electrode 190 are typically approximately 1.8-1.9. The refraction index of the upper passivation layer 180q is typically approximately 1.5, and the refraction index of the insulating substrate 110 of glass and the liquid crystal layer 300 is typically approximately 1.5. The layers having the refraction index of approximately 1.8-1.9 are inserted between the layers having the refraction index of approximately 1.5.

Figure 4:
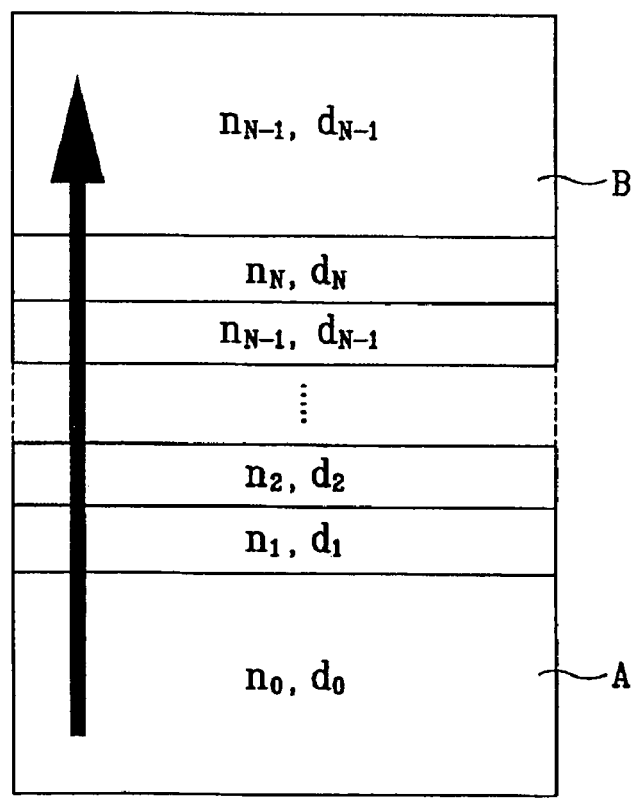
FIG. 4 is a sectional view of the deposition structure of multiple layers having different refraction indexes and difference thicknesses.

FIG. 4 is a sectional view of the deposition structure having multiple layers with different refraction indexes and different thicknesses.

Referring to FIG. 4, N layers are formed between a light-entering medium A which is the lowest layer and a light-transmitting medium B which is the highest layer of the structure. Since each layer has a different refraction index and a different thickness, the incident light on the layers is sequentially reflected which causes an interference phenomenon.

In order to generate the interference phenomenon, the difference between the refraction index of the light-entering medium and that of the light-transmitting medium should be large, and the thickness of the layers is less than a coherence length of the light. The interference is only generated between the light-entering medium and the light-transmitting medium because the light-entering medium and the light-transmitting medium are thicker than the coherence length of the light, which prevents the interference phenomenon in the light-entering medium and the light-transmitting medium. During manufacturing the insulating substrate 110 and the liquid crystal layer 300 may be thicker than the coherence length of the light.

The refraction index of each layer is referred to as ni (i=0, 1, 2, 3, . . . N, N+1), and the thickness of each layer is referred to as di (i=0, 1, 2, 3, . . . N, N+1).

The interference phenomenon is generated according to the following conditions.

$$dj \leq \text{a coherence length } (j=1, 2, 3, \ldots N)$$

$$di \geq \text{a coherence length } (i=0, N+1)$$

$$|n0-n1| \geq 0.05/(n0+n1)$$

$$|nN-n(N+1)| \geq 0.05/\{nN+n(N+1)\} \tag{1}$$

A constructive interference for the N layers is made according to the following conditions.

$$2\sum_{k=1}^{N} n_k d_k = m\lambda \ (m = 0, 1, 2, \ldots) \tag{2}$$

The optical path length (the product of the substantial thickness and the refraction index) of the layers to obtain a constructive interference is a product of the integer of λ/2.

Figure 5:
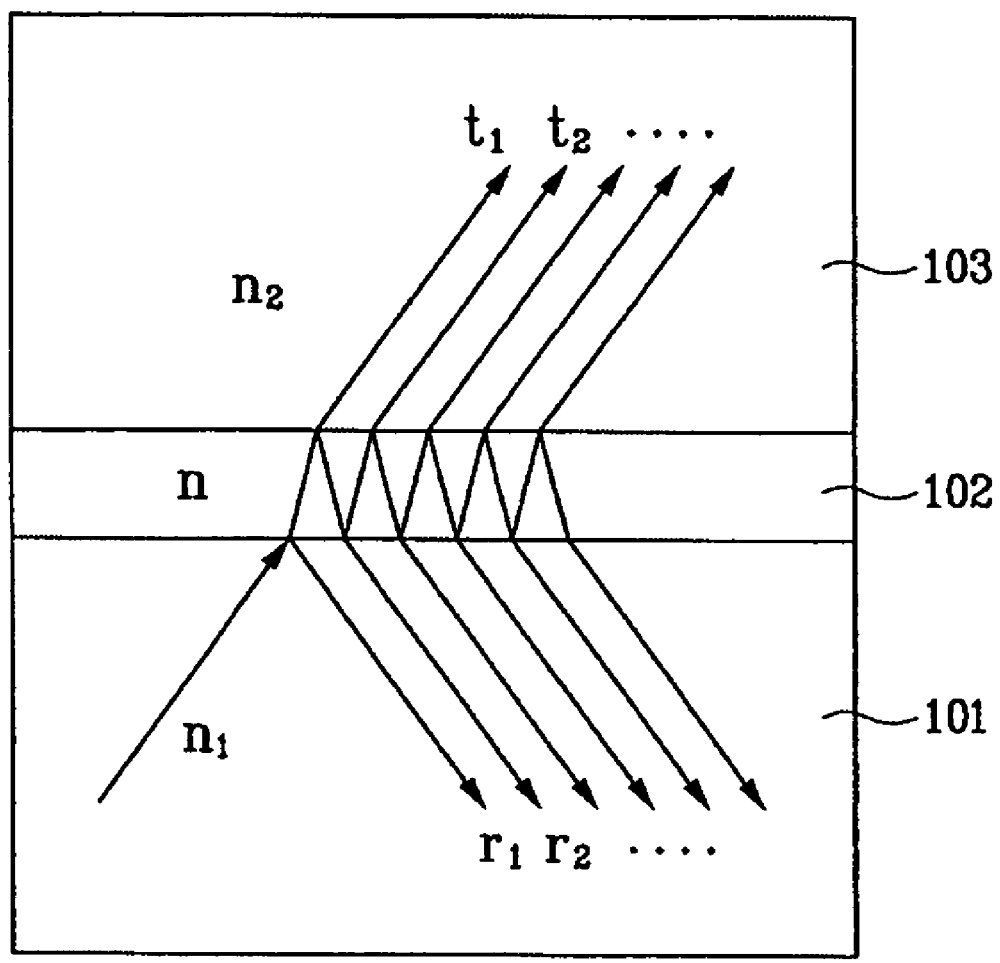
FIG. 5 shows an interference phenomenon according to multiple reflection.

FIG. 5 shows the interference phenomenon according to multiple reflections.

The maximum transmittance occurs when there is a constructive interference for phase relations of incident light. The minimum transmittance occurs when there is a destructive interference.

In the LCD, the gate insulating layer 140 and the lower passivation layer 180p, which may be made of silicon nitride, and the pixel electrode 190, which may be made of ITO or IZO, affect the transmittance through the interference. The gate insulating layer 140, the lower passivation layer 180p, and the pixel electrode 190 have refraction indexes of approximately 1.8-1.9, wherein most of the other layers having refraction indexes of approximately 1.5. Accordingly, the transmittance changes due to the interference effects.

The change of the transmittance due to the interference effects is determined by comparing the phases of transmitted light. For example, the phase changes are generated because of the optical path length (the product of the substantial thickness and the refraction index) and is the reflection at boundary surfaces between two mediums having different refraction indexes. Generally, the phase changes of transmitted light are not generated, but the phase changes of reflected light are generated by 180° when light passes through a rare medium having a low refraction index into a dense medium having a high refraction index, and is reflected. The phase changes of light are not generated when light passes through the dense medium into the rare medium.

The layered structure of FIG. 5 is adapted to the thin film transistor array panel having the gate insulating layer 140 and the lower passivation layer 180p, which are made of silicon nitride, the upper passivation layer 180q, and the pixel electrode 190, which is made of ITO or IZO. Assuming that the lower layer 101 is a nitride layer of the gate insulating layer 140 and the lower passivation layer 180p, the middle layer 102 is an organic layer of the upper passivation layer 180q, and the upper layer 103 is the pixel layer of ITO or IZO, the refraction indexes of the layers are represented as the equation of $n1 \approx n2 < n$.

The phase relations of the transmitted light are described below. First, the portions r1, r2, . . . of the light incident on the lower layer 101 with the refraction index n1 is reflected by the middle layer 102, and the rest of the light is transmitted into the middle layer 102. Next, the portions of the light incident on the middle layer 102 with the refraction index n are reflected by the upper layer 103, and the rest (t1, t2, . . . ) of the light is transmitted into the upper layer 103. This transmission and reflection is repeated within the coherence length, and the transmittance is determined by interference of the transmitted light.

The phase difference of the transmitted light t1 and t2 is calculated. The phase difference may be calculated by considering light that is vertically incident on the upper layer 103. The light t2 is reflected two times, by the upper and the lower layers. At this time, the phase differences by the refraction are not generated by the relation of $n1 \approx n2 < n$, and only the phase differences by the advance of light are generated and can be calculated as $$\Delta\phi = n \cdot 2d \cdot \frac{2\pi}{\lambda}. \tag{3}$$

Here, $\Delta\Phi$ is the phase differences, n is the refraction index, d is the thickness of the layer, and $\lambda$ is the wavelength of light. When the phase difference is an even multiple of $\pi$, the transmittance is a maximum according to the constructive interference. When the phase difference is an odd multiple of $\pi$, the transmittance is a minimum according to the destructive interference. Thus, if 4nd is an even multiple of the wavelength, the constructive interference is generated, and if 4nd is an odd multiple of the wavelength, the destructive interference is generated.

The constructive and the destructive interferences may be represented as in the equation below. The equation of the constructive interference is referred to as a condition equation of the optimized thickness of the layer.

$$4\sum_{k=1}^{N} n_k d_k \tag{4}$$

The wavelength of visible rays is in the range of 380-780 nm. Accordingly, when the wavelength of visible rays is similar to 4nd, the transmittance is significantly changed. When the wavelength of the visible rays is much smaller than 4D, the transmittance according to the wavelength oscillates, and the influence for the total transmittance is slight. Generally, because the thickness of the organic layer (180q) is in the range of about 3 microns, which is much larger than the wavelength, when the thickness of the organic upper passivation layer 180q charges, the transmittance does not change much (which will be described later through a simulation referring to FIG. 10). When considering that the coherence length of light is several microns, the interference effects are insignificant.

Finally, at least the following conditions must be satisfied to significantly change the transmittance of a layer by the interference:

(1) the differences of refraction indexes between the layers should be large; and (2) the thickness of the layer should be similar to the wavelength.

To obtain the maximum transmittance, the 4nd must be an even multiple of the wavelength. When the differences between the refraction indexes of the layers are small, little reflection occurs and the interference effect by multiple reflection is small. When the thickness of the layer is greater than the coherence length, the interference effects are not generated, and the thickness is irrelevant.

A simulation and the result of the simulation are described below through the above-described theory.

The Berreman method of 4×4 is used to calculate reflectance and transmittance, as well as a multiple reflective effect.

Three layers, including a silicon nitride layer of the gate insulating layer 140 and the lower passivation layer 180p, an organic layer of the upper passivation layer 180q, and the pixel layer of ITO are simulated.

Figure 6:
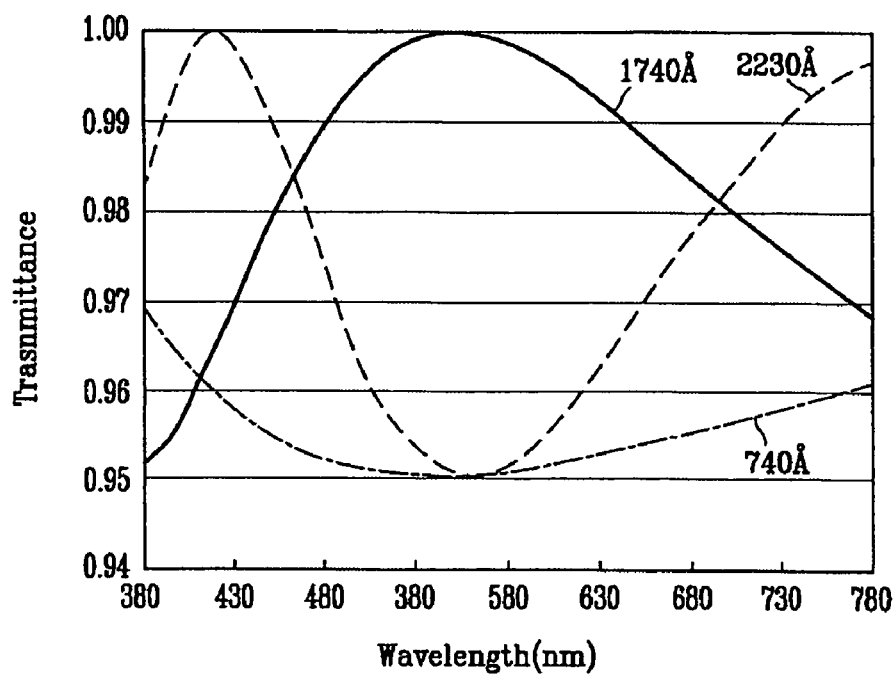
FIG. 6 is a graph showing transmittance curves of wavelength according to thicknesses of the pixel electrodes.

FIG. 6 is a graph showing the transmittance of the wavelength according to the thickness of the pixel electrodes.

As shown in FIG. 6, only the pixel electrode 190 is formed without the silicon nitride layer (140 and 180p) or the organic layer (180q), and the transmittance according to a change of the thickness of the pixel electrode 190 is measured. The refraction indexes of the light-entering medium and the light-transmitting medium are approximately 1.54.

The thickness is measured using the condition equation of the optimized thickness of the layer. Because the refraction index of ITO is approximately 1.88, d is 1470 Å by 4*1.88*d=5550*2. 5550 is the wavelength of visible rays and the denomination is Å. A curve of the transmittance of the thickness of about 1470 Å is shown in FIG. 6.

On the other hand, the thicknesses of the pixel electrode causing destructive interference are approximately 740 Å and 2230 Å, and a curve of the transmittances of these thicknesses are simulated.

Referring to FIG. 6, the transmittances of the thickness of about 740 Å and 2230 Å are a minimum, and the transmittance of the thickness of about 1470 Å is a maximum.

Figure 7:
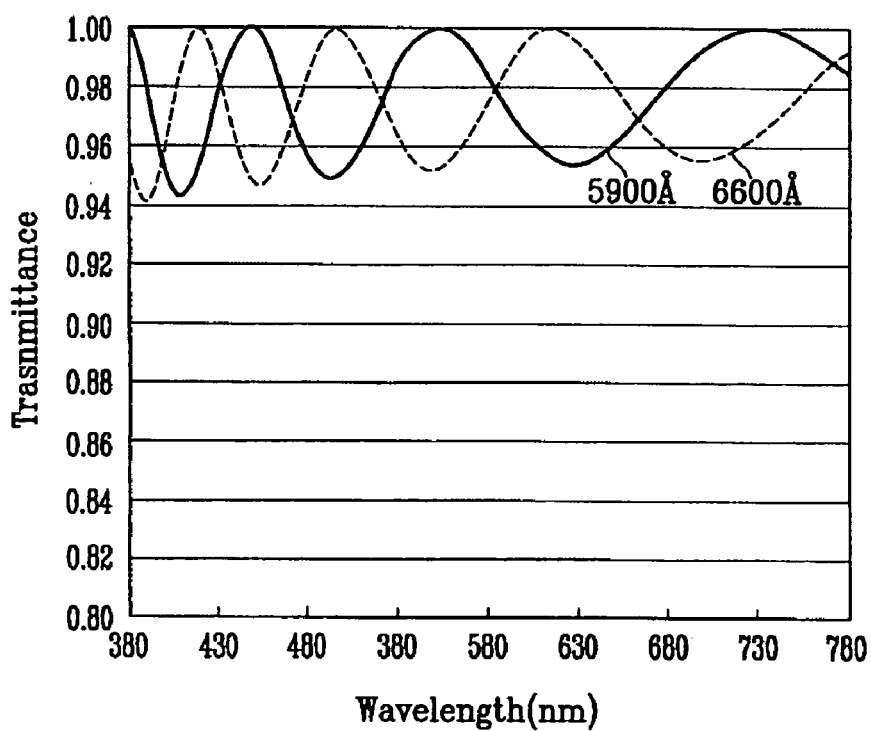
FIG. 7 is a graph showing transmittance curves of wavelength according to thicknesses of the silicon nitride layer.

FIG. 7 is a graph showing transmittance curves of the wavelength according to thicknesses of the silicon nitride layer.

Here, only the silicon nitride layer is formed without the organic layer (180q) or the pixel electrode 190, and the transmittance according to a change of the thickness of the silicon nitride layer is measured. The refraction indexes of the light-entering medium and the light-transmitting medium are approximately 1.54.

The thickness causing the constructive and the destructive interferences is measured by the condition equation of the optimized thickness of the layer upon considering the refraction index of the silicon nitride to be approximately 1.88 for the wavelength of 5550 Å. Curves of the transmittances of the thicknesses of approximately 5900 Å and 6600 Å, from among various thicknesses, are shown in FIG. 7.

Referring to FIG. 7, because the thickness of the silicon nitride layer including the gate insulating layer 140 and the lower passivation layer 180p is greater than the thickness of the pixel electrode 190, the curves of the transmittances oscillate more tightly than the curves of the pixel electrode 190. However, differences of the luminance according to thickness are small compared with those of the pixel electrode 190.

The curve of the thickness of 5900 Å shows the transmittance of constructive interference for the wavelength of 5550 Å. The curve of the thickness of 6600 Å shows the transmittance of destructive interference for the wavelength of 5550 Å.

Figure 8:
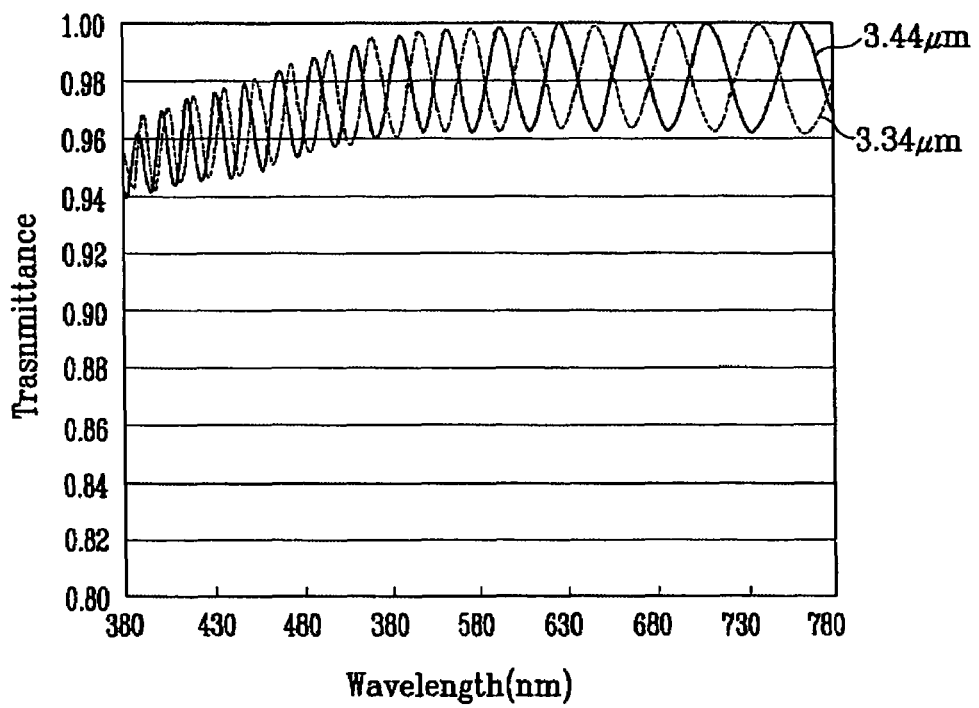
FIG. 8 is a graph showing transmittance curves of wavelength according to thicknesses of the organic insulating layer.

FIG. 8 is a graph showing the transmittance of the wavelength according to thicknesses of the organic layer.

Here, only the organic layer (180q) is formed, without the silicon nitride layer (180p and 140) or the pixel electrode 190, and the transmittance according to a change of the thickness of the organic upper passivation layer 180q is measured. The refraction indexes of the light-entering medium and the light-transmitting medium are approximately 1.88. This is because the refraction index of the organic layer (180q) is approximately 1.54, which is disposed between the silicon nitride layer (180p and 140) and the pixel electrode 190 with the refraction index of approximately 1.88.

The thicknesses causing the constructive and the destructive interferences for the wavelength of 5550 Å are respectively approximately 3.34 microns and 3.44 microns and curves of the transmittances of these thicknesses are shown in FIG. 8.

Compared to FIG. 7, because the organic layer (180q) is thicker than the silicon nitride layer, the curves of the transmittances more tightly oscillate. However, differences of the luminance according to thickness are small.

The curve of the thickness of 3.34 microns shows the transmittance of constructive interference for the wavelength of 5550 Å. The curve of the thickness of 3.34 microns shows the transmittance of destructive interference for the wavelength of 5550 Å.

Figure 9:
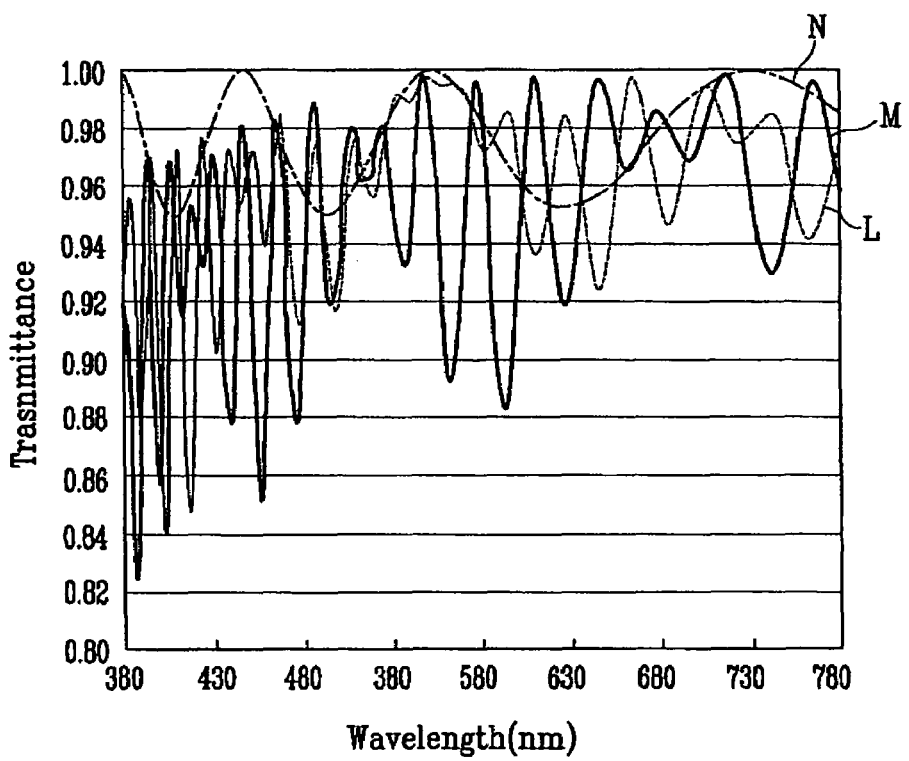
FIG. 9 is a graph showing transmittance curves according to wavelength for optimized thicknesses of the multiple layers.

FIG. 9 is a graph showing transmittance curves according to wavelength for the optimized thicknesses of the multiple layers including a silicon nitride layer, an organic layer, and a pixel electrode.

M is a curve showing the transmittance for the optimized thickness of the multiple layers in which the organic layer is inserted as the upper passivation layer 180q.

L is a curve showing the transmittance for the multiple layers that satisfies the condition equation shown below according to an embodiment of the invention.

$$4(d_G n_G + d_P n_P) = \text{even multiple of the wavelength} \tag{5}$$

$$4d_I n_I = \text{even multiple of the wavelength} \tag{6}$$

Here, "G" refers to the gate insulating layer. "P" refers to the lower passivation layer. "I" refers the pixel electrode.

The silicon nitride layer including the gate insulating layer and the lower passivation layer, and the pixel electrode, which are respectively provided under and over the organic layer of the upper passivation layer, have thicknesses satisfying a condition of constructive interference.

Referring to FIG. 9, for example, the curve M has large oscillations and low transmittance as compared with the curve L. Accordingly, the multiple layers satisfying the optimized condition according to the embodiment of the present invention have higher transmittance than those of multiple layers satisfying the conventional optimized conditions.

The silicon nitride layer and the pixel electrode have a total thickness that satisfies the condition of constructive interference when the organic layer is omitted. The nitride layer and the pixel electrode must individually have thicknesses satisfying the condition of constructive interference when the organic layer is inserted.

N is a curve showing transmittance for the optimized thickness of the silicon nitride that satisfies a condition of constructive interference, as shown in FIG. 7. Referring to FIG. 9, the M curve and the L curve have oscillation periods of constructive interference of the silicon nitride.

Figure 10:
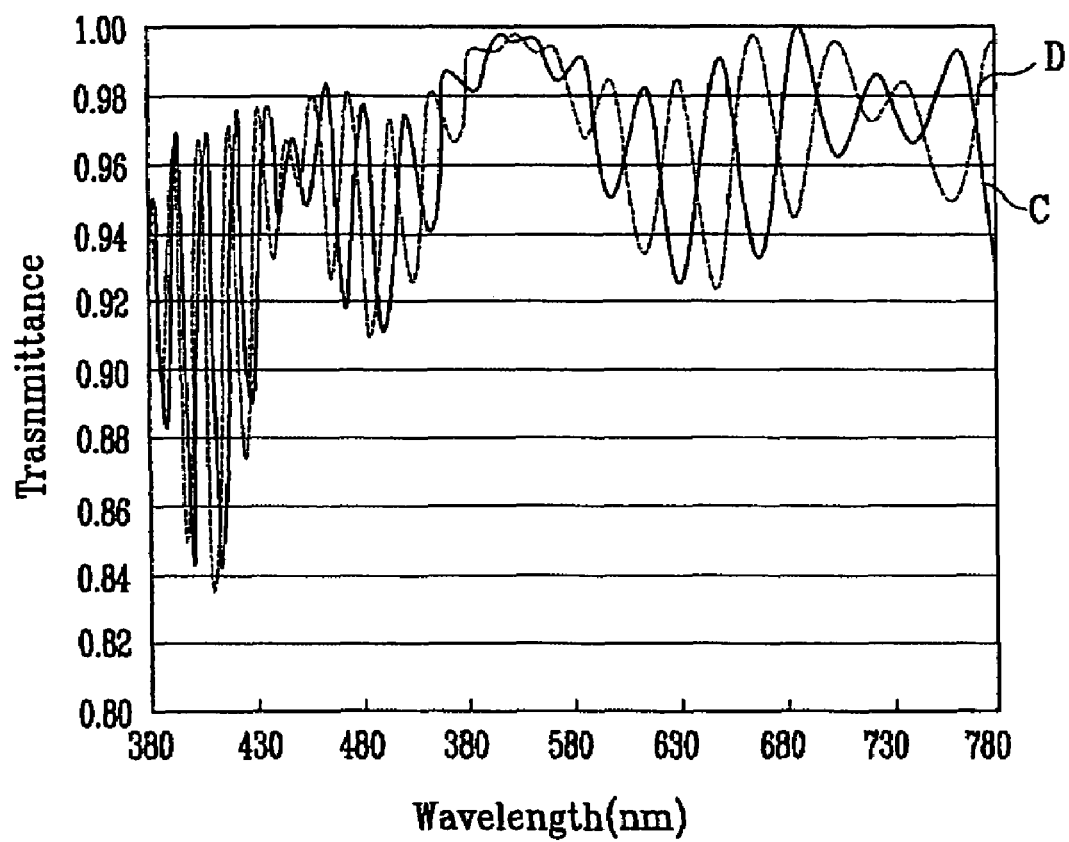
FIG. 10 is a graph showing transmittance curves according to wavelength for thickness of the organic layer in the display device with the optimized thicknesses of the multiple layers.

FIG. 10 is a graph showing transmittance curves according to wavelength for the thickness of the organic layer in the display device with the optimized thicknesses of the multiple layers.

The thickness of silicon nitride layer and the pixel electrode are optimized by changing the thickness of the organic layer, as shown in the curve L or FIG. 9.

Curve C shows the transmittance of constructive interference for the wavelength of 5550 Å. Curve D shows the transmittance of destructive interference for the wavelength of 5550 Å.

Referring to FIG. 10, although the thickness of the organic layer charges, the transmittances are substantially similar to each other but the oscillations positions are exchanged. Accordingly, the thickness of the organic layer minimally influences the transmittance.

The results described below may be obtained through the above-described simulation.

The gate insulating layer 140 and the lower passivation layer 180p, which are made of silicon nitride, are formed with the total thickness of the condition of constructive interference, and the pixel electrode of ITO or IZO is formed with the individual thickness of the condition of constructive interference.

Because the organic layer of the upper passivation layer 180q between the pixel electrode 190 and the lower passivation layer 180p is thick, the organic layer does not generate the interference effect, and there is only a change of transmittance. Therefore, the thickness of the organic layer does not need to be considered.

As described above, the silicon nitride layer and the pixel electrode are formed with the individual thicknesses of the condition of constructive interference, thereby enhancing the transmittance of the display device and the quality thereof.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents

What is claimed is:

1. A thin film transistor array panel, comprising:
   an insulating substrate;
   a gate line formed on the insulating substrate;
   a gate insulating layer covering the gate line;
   a data line formed on the gate insulating layer;
   a lower passivation layer covering the data line;
   an upper passivation layer formed on the lower passivation layer and comprising an organic insulating material; and
   a pixel electrode formed on the upper passivation layer,
   wherein the gate insulating layer, the lower passivation layer, and the pixel electrode satisfy the following condition equations:

$4(d_G n_G + d_P n_P)$=which is an even multiple of a wavelength of light; and $4d_I n_I$=which is an even multiple of the wavelength, and, wherein the thicknesses of the gate insulating layer, the lower passivation layer, and the pixel electrode are represented as $d_G$, $d_P$, and $d_I$, respectively, and the refraction index of the gate insulating layer, the passivation layer, and the pixel electrode are represented as $n_G$, $n_P$, and $n_I$, respectively.

2. The thin film transistor array panel of claim 1, wherein the lower passivation layer comprises a silicon nitride.

3. The thin film transistor array panel of claim 2, wherein the refraction index of the silicon nitride is between approximately 1.8-1.9.

4. The thin film transistor array panel of claim 1, wherein the refraction index of the pixel electrode is between approximately 1.8-1.9.

5. The thin film transistor array panel of claim 1, wherein the refraction index of the upper passivation layer is between approximately 1.4-1.6.

6. A liquid crystal display, comprising:
   a first substrate;
   a gate insulating layer formed on the first substrate;
   a lower passivation layer formed on the gate insulating layer;
   an upper passivation layer formed on the lower passivation layer and comprising an organic insulating material;
   a pixel electrode formed on the upper passivation layer;
   a second substrate facing the first substrate; and
   a liquid crystal layer formed between the first substrate and the second substrate,
   wherein the gate insulating layer, the lower passivation layer, and the pixel electrode satisfy the following condition equations:

$4(d_G n_G + d_p n_p)$=which is an even multiple of a wavelength of light, and $4d_1 n_1$=which is an even multiple of the wavelength, and wherein the thicknesses of the gate insulating layer, the lower passivation layer, and the pixel electrode are represented as $d_G$, $d_p$, and $d_1$, respectively, and the refraction index of the gate insulating layer, the passivation layer, and the pixel electrode are represented as $n_G$, $n_p$, and $n_1$, respectively.

* * * * *